(12) United States Patent
Gu et al.

(10) Patent No.: US 11,615,999 B1
(45) Date of Patent: Mar. 28, 2023

(54) ORIENTED HEAT CONDUCTING SHEET AND PREPARATION METHOD THEREOF, AND SEMICONDUCTOR HEAT DISSIPATING DEVICE

(71) Applicant: GUANGDONG SUQUN NEW MATERIAL CO., LTD, Guangdong (CN)

(72) Inventors: Zhoujie Gu, Guangdong (CN); Hao Wang, Guangdong (CN); Zeming Ren, Guangdong (CN)

(73) Assignee: GUANGDONG SUQUN NEW MATERIAL CO., LTD, Guangdon (CN)

( * ) Notice: Subject to any disclaimer, the term of this patent is extended or adjusted under 35 U.S.C. 154(b) by 0 days.

(21) Appl. No.: 17/870,889

(22) Filed: Jul. 22, 2022

(51) Int. Cl.
| | |
|---|---|
| H01L 23/373 | (2006.01) |
| C08J 5/18 | (2006.01) |
| H01L 23/42 | (2006.01) |
| H01L 23/36 | (2006.01) |
| C09K 5/14 | (2006.01) |
| C08G 77/12 | (2006.01) |
| C08G 77/20 | (2006.01) |
| C08G 77/08 | (2006.01) |

(Continued)

(52) U.S. Cl.
CPC .............. *H01L 23/373* (2013.01); *C08J 5/18* (2013.01); *H01L 23/36* (2013.01); *H01L 23/3737* (2013.01); *H01L 23/42* (2013.01); *C08G 77/08* (2013.01); *C08G 77/12* (2013.01); *C08G 77/20* (2013.01); *C08J 2383/05* (2013.01); *C08J 2383/07* (2013.01); *C08K 7/06* (2013.01); *C08K 7/18* (2013.01); *C08K 2201/001* (2013.01); *C09K 5/14* (2013.01)

(58) Field of Classification Search
CPC ... H01L 23/36; H01L 23/373; H01L 23/3737; H01L 23/42
See application file for complete search history.

(56) References Cited

U.S. PATENT DOCUMENTS

| | | | |
|---|---|---|---|
| 2006/0035085 A1* | 2/2006 | Ozaki | C04B 35/63468 428/408 |
| 2022/0347996 A1* | 11/2022 | Kudoh | B29C 70/88 |

FOREIGN PATENT DOCUMENTS

| | | |
|---|---|---|
| CN | 100548099 C | 10/2009 |
| CN | 107004651 A | 8/2017 |
| CN | 108463882 A | 8/2018 |

(Continued)

*Primary Examiner* — Feifei Yeung Lopez
(74) *Attorney, Agent, or Firm* — Cooper Legal Group, LLC

(57) ABSTRACT

The present application disclose a method for preparing an oriented heat conducting sheet, which includes the following steps: Step S1, preparing a fluid composition for the heat conducting sheet; Step S2, placing the fluid composition obtained in the step S1 in an orientation molding device, applying a circumferential high-speed shear force to the fluid composition layer by layer to enable thermal conducting fillers in the fluid composition to be oriented along a shear direction to form an oriented thin-layer composition, and collecting the thin-layer composition layer by layer in a die to form a continuous multi-layer aggregate; Step S3, heat curing the multi-layer aggregate to obtain an oriented composition block; and S4, slicing the oriented composition block along the direction perpendicular to an orienting direction of the oriented composition block to obtain an oriented heat conducting sheet.

10 Claims, 4 Drawing Sheets

(51) Int. Cl.
*C08K 7/18* (2006.01)
*C08K 7/06* (2006.01)

(56) References Cited

FOREIGN PATENT DOCUMENTS

| | | |
|---|---|---|
| CN | 109891577 A | 6/2019 |
| CN | 110734562 A | 1/2020 |
| JP | 2009066817 A | 4/2009 |
| JP | 2017135211 A | 8/2017 |
| JP | 2018046073 A | 3/2018 |
| WO | 2016104169 A1 | 6/2016 |

\* cited by examiner

ORIENTED HEAT CONDUCTING SHEET AND PREPARATION METHOD THEREOF, AND SEMICONDUCTOR HEAT DISSIPATING DEVICE

TECHNICAL FIELD

The present application relates to the field of preparation of heat conducting sheets and semiconductor heat dissipation, and, in particular, to a method for preparing an oriented heat conducting sheet and a semiconductor heat dissipating device.

BACKGROUND

With the development of 5G technology, the power density of chips continues to increase, which puts forward higher requirements for the heat dissipation of chips. In the heat dissipation components, heat conducting silica gel gaskets are usually used to reduce the interface thermal resistance between the chip and the radiator and improve the heat dissipation efficiency.

At present, the conventional heat conducting silica gel gaskets are realized by filling isotropic spherical thermal conducting fillers (alumina, aluminum nitride, zinc oxide, etc.) in a silica gel matrix. Due to a low intrinsic thermal conductivity of spherical ceramic fillers, the thermal conductivity of the gaskets can hardly exceed 10 W/m·k.

Among the anisotropic thermal conducting fillers, fibrous or sheet-like thermal conducting fillers often have high thermal conductivity along the fiber length direction or the in-plane direction of the sheet. For example, the axial thermal conductivity of mesophase pitch-based carbon fibers can reach 900 W/m·k , and the in-plane thermal conductivity of hexagonal boron nitride micro-sheets can reach 400 W/m·k. Therefore, using anisotropic thermal conducting fillers and orienting them along the thickness direction of the gaskets is one of the effective methods for preparing silica gel gaskets with high thermal conductivity.

In published patents, the anisotropic fillers are generally oriented by magnetic field methods, extrusion methods and fluid shear methods. In a published Chinese patent application No. CN100548099C from Perimar Technology Co., Ltd., a superconducting magnetic field is used and vibration at a certain frequency is applied to orient carbon fibers with high loading in a direction of the magnetic field in a high-viscosity composition. Since the densities of the added alumina and carbon fiber fillers are respectively 3.8 times and 2 times of the density of the silicone resin matrix will cause the fillers to settle after the vibration is applied, causing an overall non-uniformity of the composition, and ultimately affecting the uniformity of thermal conductivity. In addition, the superconducting magnets are expensive and expensive to operate, increasing the cost. Published China patent application Nos. CN107004651A, CN108463882A and CN109891577A are from Dexerials Co., Ltd., in which an extrusion method is used to orient the carbon fiber along the extrusion direction. However, it is found that, in order to prepare a high heat conducting sheet, when a mass ratio of the loaded carbon fiber to the resin exceeds 1.3, a viscosity of the composition is high, the fluidity is deteriorated, and the extrusion processing becomes difficult. In addition, when molding in a hollow die, due to poor fluidity, gaps are easily formed between adjacent extruded bodies, the extrusion method is not suitable for the orientation of high-loading compositions. Published China patent application No. CN110734562A uses an annular groove for circumferential motion to orient the fibers in the composition in the groove along the direction of rotation. This method has the following two disadvantages: 1. the size of the obtained annular cured substance is limited by the size of the annular groove, therefore, the width of the heat conducting sheet obtained by slicing the annular cured substance in the radial direction is also limited by the width of the annular groove, and a heat conducting sheet with a larger width cannot be obtained; 2. when the width of the annular groove becomes larger, only the composition near the both sides of the wall of the annular groove is oriented at this time, and the interior of the composition cannot be subjected to frictional force with the wall of the groove, so the composition will be oriented insufficiently. These disadvantages are especially reflected in the composition with a high viscosity, resulting in the failure to obtain a heat conducting sheet with high orientation and high thermal conductivity.

BRIEF SUMMARY

In view of this, the present application provides a method for preparing an oriented heat conducting sheet, which combines a high-speed shear orientation with a continuous molding device to prepare an oriented heat conducting sheet having high orientation, high thermal conductivity and homogeneity.

The present application further provides an oriented heat conducting sheet.

The present application still further provides a semiconductor heat dissipating device.

In a first aspect, a method for preparing an oriented heat conducting sheet includes the following steps:

Step S1, preparing a fluid composition for the heat conducting sheet;

Step S2, orientation molding: placing the fluid composition obtained in step S1 in an orientation molding device, and applying a circumferential high-speed shear force to the fluid composition layer by layer to enable thermal conducting fillers in the fluid composition to be oriented along a shear direction to form an oriented thin-layer composition, and collecting the thin-layer composition layer by layer in a die to form a continuous multi-layer aggregate;

Step S3, curing: heat curing the multi-layer aggregate obtained in step S2 to obtain an oriented composition block; and Step S4, slicing: slicing the oriented composition block obtained in step S3 along the direction perpendicular to an orienting direction of the oriented composition block to obtain an oriented heat conducting sheet. Further, the step S1 includes mixing and defoaming an addition type silicone oil and the thermal conducting fillers to form the fluid composition with a certain viscosity. In some embodiments, the viscosity of the fluid composition is 200,000 to 3,000,000 mPa·s. The addition type silicone oil is a silica gel obtained after a vinyl silicone oil and a hydrogen-containing silicone oil undergo an addition reaction (heating) under the action of a catalyst; preferably, the addition type silicone oil is a mixture of a vinyl silicone oil, a hydrogen-containing silicone oil and a platinum catalyst.

Further, in step S1, the thermal conducting fillers contains two types of the thermal conducting fillers, one is a fibrous high thermal conducting filler and/or a sheet-like high thermal conducting filler, the other is a spherical thermal conducting filler. In the present application, the spherical thermal conducting fillers are added to increase the contact between the adjacent high thermal conducting fillers, so as to increase the kinds of the heat conducting networks.

Further, the fibrous high thermal conducting filler is a carbon fiber, a carbon nanotube fiber or a graphene fiber; the sheet-like high thermal conducting filler is a hexagonal boron nitride micro-sheet or a graphite micro-sheet; and the spherical thermal conducting filler is selected from one or more of an alumina, an aluminum nitride and a silicon carbide.

Further, in step S1, a mass ratio of the fibrous or sheet-like high thermal conducting filler to the silicone oil is 0.5 to 2.5, and the spherical thermal conducting filler accounts for 50 to 80% of a total mass of the fluid composition.

Further, in step S2, the orientation molding device drives the fluid composition to perform a circumferential motion, and during the circumferential motion, applying the high-speed shear force to the fluid composition along the circumference layer by layer to orient the thermal conducting fillers in the fluid composition along the shear direction, thereby forming the oriented thin-layer composition.

Further, in step S2 of the present application, an orientation molding device is used, and the orientation molding device includes:

a cylindrical rotating barrel, wherein a rotating shaft is fixed on a central axis of the rotating barrel, and one end of the rotating shaft is provided with a first motor, and the first motor drives the rotating barrel to rotate via the rotating shaft; the rotating barrel is provided with a loading zone, and a rotating barrel opening is provided at a lower side of the loading zone;

a sleeve barrel, wherein the sleeve barrel is sleeved outside the rotating barrel, the rotating barrel is configured to rotate inside the sleeve barrel, and a sleeve barrel opening with a same size as the barrel opening is arranged at an end of the sleeve barrel opposite to the rotating barrel opening;

the die, wherein the die is provided with an inner cavity and an inner cavity opening, and an edge of the inner cavity opening is flush with and next to an edge of the sleeve barrel opening, the edge of the inner cavity opening extends inwardly along a horizontal direction perpendicular to the central axis of the rotating barrel to form a side wall of the inner cavity, a piston and a second motor are provided next to the side wall of the inner cavity; the second motor is configured to drive the piston away from the sleeve barrel opening, a starting position of the piston is flush with the sleeve barrel opening; and an electric heating module, wherein the electric heating module is configured to heat the inner cavity of the die.

Further, there is a gap between the rotating barrel and the sleeve barrel, and a distance of the gap is 0.1 to 5 mm.

Further, the loading zone is symmetrically arranged around the central axis of the rotating barrel; preferably, the loading zone is two sectorial cylindrical zones symmetrically arranged around the central axis of the rotating barrel.

Further, the piston is driven by the second motor to leave the sleeve barrel opening intermittently; preferably, an interval time of the intermittence is t (min), the t≥π/107, the ω is a angular velocity (r/min) of the rotating barrel.

Further, in the present application, preferably, a speed of the piston leaving the sleeve barrel opening each time is v (mm/min), and the v≤D·ω/2, the D (mm) is the distance between the rotating barrel and the sleeve barrel, the w is the angular velocity (r/min) of the rotating barrel.

Further, an interlayer is provided in the sleeve barrel, and filled with a cooling medium. In some embodiments, the cooling medium is water.

In a second aspect, the present application provides an oriented heat conducting sheet prepared by the above-mentioned method for preparing an oriented heat conducting sheet.

In a third aspect, the present application provides a semiconductor heat dissipation device, which includes an oriented heat conducting sheet prepared by the above-mentioned method for preparing an oriented heat conducting sheet or provided in the second aspect, in which the oriented heat conducting sheet is sandwiched between a packaged chip and a radiator.

Further, the radiator is a finned radiator or a vacuum vapor chamber.

Compared with the prior art, the beneficial effects of the present application are as follows.

The present application creatively adopts a continuous thin-layer fluid shear orientation method, which combines a high-speed shear orientation and a continuous molding device. The high-speed shear orientation can effectively make the fibrous or sheet-like high thermal conducting fillers in each thin-layer composition are fully oriented, and the viscosity range of the applicable composition is wide. The continuous molding device is used to make each fully oriented thin-layer composition form a dense aggregate, so the aggregate prepared by this method has good orientation, few defects and high efficiency. The heat conducting sheet obtained by slicing has high orientation, high thermal conductivity and uniformity, and at the same time, the heat conducting sheet can be well applied to a semiconductor heat dissipation device.

BRIEF DESCRIPTION OF DRAWINGS

The drawings constituting a part of the present application are used to provide further understanding of the present application, and the exemplary embodiments of the present application and their descriptions are used to explain the present application and not to limit the present application.

DETAILED DESCRIPTION

The present application will be described in detail below with reference to the drawings. The description in this part is only exemplary and explanatory, and should not have any limiting effect on the protection scope of the present application. In addition, according to the description in this document, those skilled in the art can make corresponding combinations of features in the Example s and in different Example s in this document.

Example 1

Figure 1:
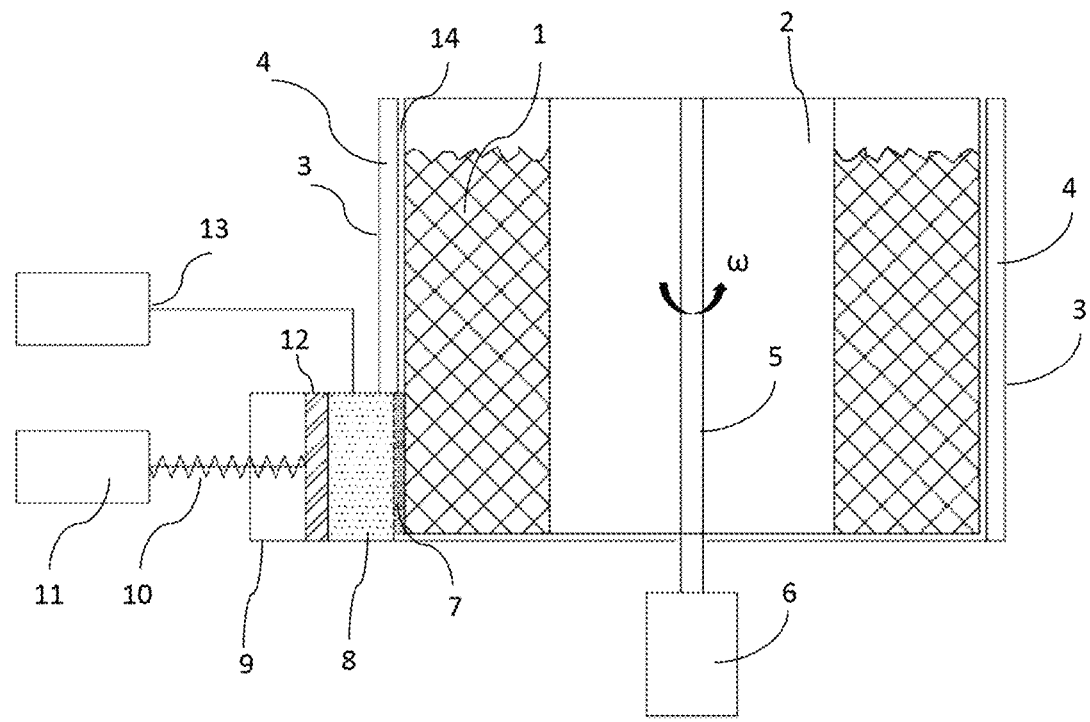
FIG. 1 is a schematic sectional view of the orientation molding device in Example 1.
Figure 2:
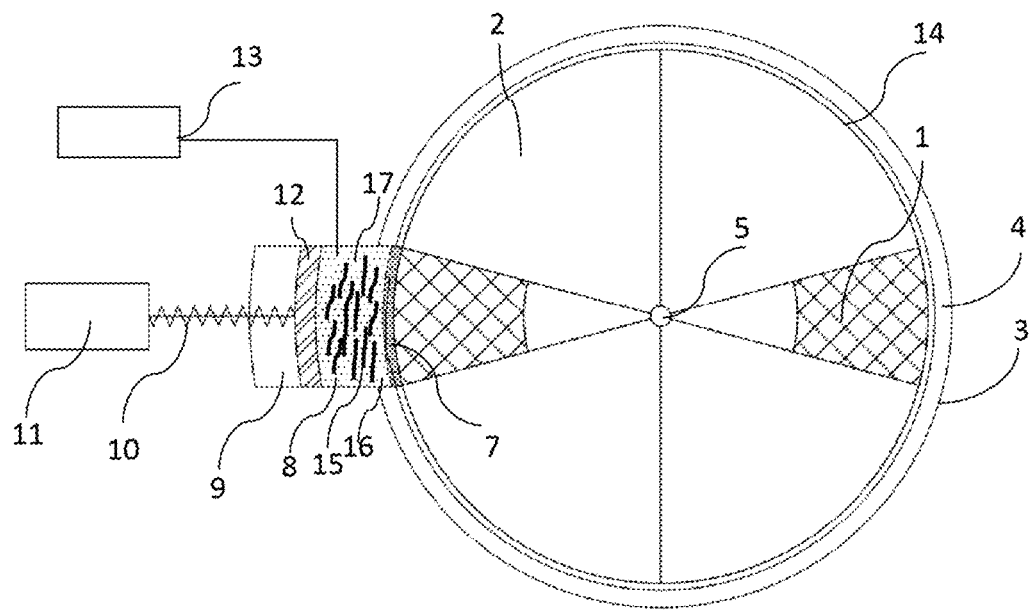
FIG. 2 is a schematic top view of the orientation molding device in Example 1.

This Example provides an orientation molding device, referring to FIG. 1 and FIG. 2, the orientation molding device includes:

a cylindrical rotating barrel 2, in which a rotating shaft 5 is fixed on a central axis of the rotating barrel 2, and one end of the rotating shaft 5 is provided with a first motor 6, and the first motor 6 drives the rotating barrel 2 to rotate via the rotating shaft 5; the rotating barrel 2 is provided with an axisymmetric loading zone 1, and the loading zone 1 is two sectorial cylindrical zones, and the two sectorial cylindrical zones are symmetrically arranged around the central axis of the rotating barrel; and a rotating barrel opening is provided at a lower side of the loading zone 1;

a sleeve barrel 3, in which the sleeve barrel 3 is provided with an interlayer, and the interlayer is filled with a cooling medium 4; the sleeve barrel 3 is sleeved outside the rotating barrel 2, and in this Example, there is a gap 14 between the rotating barrel 2 and the sleeve barre13, and the distance of the gap 14 is 0.1 to 5 mm; the rotating barrel 2 is configured to rotate inside the sleeve barrel 3, and a sleeve barrel opening with a same size as the rotating barrel opening is arranged at an end of the sleeve barrel 3 opposite to the rotating barrel opening;

a die 9, in which the die 9 is provided with an inner cavity and an inner cavity opening, and an edge of the inner cavity opening is flush with and next to an edge of the sleeve barrel opening, and the edge of the inner cavity opening extends inwardly along a horizontal direction perpendicular to the central axis of the rotating barrel 2 to form a side wall of the inner cavity; and the die 9 is provided with a piston 12 and a second motor 11 which are arranged next to the side wall of the inner cavity; the output end of the second motor 11 is a screw 10, the screw 10 is connected with the piston 12, the second motor 11 configured to drive the piston 12 away from the sleeve barrel opening through the screw 10, a starting position of the piston 12 is flush with the sleeve barrel opening; in this embodiment, during the operation of the orientation molding device, the piston intermittently moved away from the sleeve barrel opening, and a interval time of the intermittence is t (min), the t≥π/ω, the ω is a angular velocity (r/min) of the rotating barrel; and a speed of the piston leaving the sleeve barrel opening each time is v (mm/min) which meets the condition of v≤D×ω/2, where the D (mm) is the distance between the rotating barrel and the sleeve barrel, and the w is the angular velocity (r/min) of the rotating barrel; and an electric heating module 13, in which the electric heating module13 is a configured to heat the inner cavity of the die 9.

The preparation of the oriented heat conducting sheet was carried out by specifically using the orientation molding device of this Example, the specific operation steps were as follows.

Figure 3:
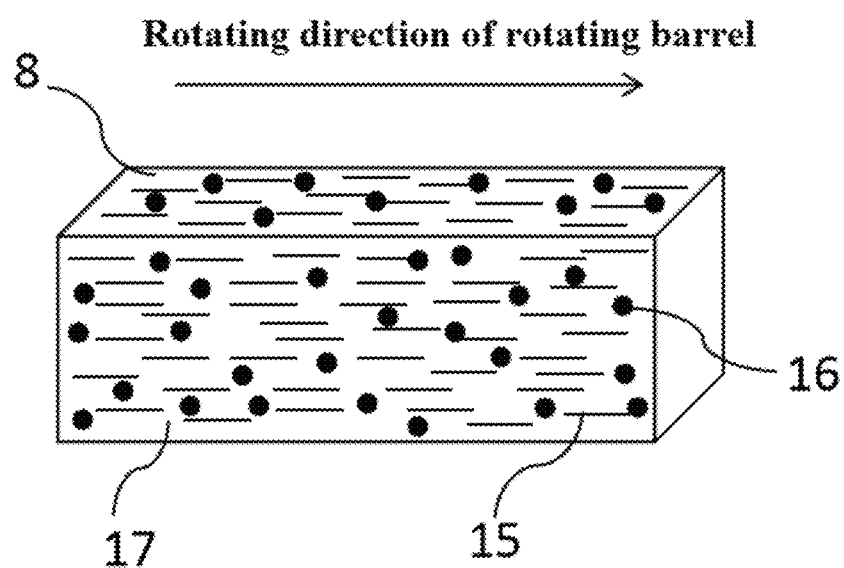
FIG. 3 is a schematic view of the aggregate after orientation using the orientation molding device in Example 1 in the preparation process of the oriented heat conducting sheet.
Figure 4:
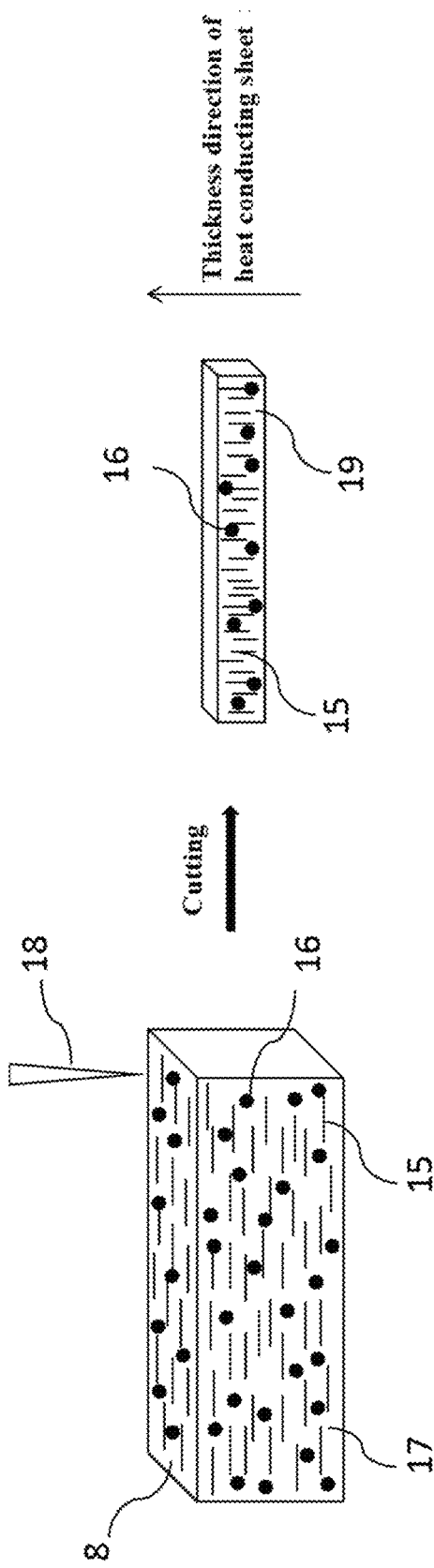
FIG. 4 is a schematic view showing a process for preparing the oriented heat conducting sheet obtained by curing and slicing the aggregate using the orientation molding device in Example 1.

A prepared fluid composition was placed in the symmetrical loading zone 1 in the rotating barrel 2 of the orientation molding device, the angular velocity of the rotating barrel 2 is set to be ω for a circumferential motion, and the interlayer in the fixedly arranged sleeve barrel 3 was filled with a circulating cooling medium 4. During the circumferential motion, the fluid composition in the loading zone 1 entered the gap 14 between the rotating barrel 2 and the sleeve barrel 3 from the rotating barrel opening at the lower side of the rotating barrel 2 under the action of a centrifugal force, specifically as shown in FIG. 2. In the gap 14, the fluid composition was sheared at a high speed to form a thin-layer composition 7 in which the carbon fibers were oriented in the direction of the shear force. The interval time of the piston 12 leaving the sleeve barrel opening was set as t, and the speed of the piston 12 leaving the sleeve leaving opening each time was set as v. At this time, referring to FIG. 3, the thin-layer composition 7 was collected layer by layer in the inner cavity of the die 9 through the inner cavity opening to form a continuous multi-layer aggregate 8. In this Example, the fluid composition was composed of a fibrous or sheet-like high thermal conducting filler 15, a spherical thermal conducting filler 16 and a silica gel matrix 17. Referring to the multi-layer aggregate 8 shown in FIGS. 2 and 3, it can be seen that the fibrous or sheet-like high thermal conducting filler 15, the spherical thermal conducting filler 16 and the silica gel matrix 17 were uniformly dispersed in the multi-layer aggregate 8 in the direction of the shear force. After the multi-layer aggregate 8 was formed, the electric heating module 13 was turned on, and the die 9 was electrically heated to an appropriate temperature and time, so that the multi-layer aggregate 8 inside the die 9 was heat cured to obtain an oriented composition block. Next, a slicing process was performed, referring to FIG. 4, the oriented composition block was sliced step by step along the thickness direction using the ultrasonic cutting knife 18, and each step increment was set to obtain a specific thickness of the oriented heat conducting sheet 19.

Example 2

This Example provides a method for preparing an oriented heat conducting sheet, using an orientation molding device in Example 1, and the specific implementation steps are as follows:

Step S1, mixing: 100 g of addition type silicone oil (a mixture of 55 g of vinyl silicone oil, 44.9 g of hydrogen-containing silicone oil and 0.1 g of platinum catalyst), 75 g of carbon fiber powder (with a length of 0.1 mm and a diameter of 15 μm) and 300 g of spherical alumina were mixed and stirred for 30 min. After defoaming in vacuum for 5 minutes, a fluid composition with a viscosity of 200,000 mPa×s was formed;

Step S2, orientation molding: the fluid composition obtained in step S1 was placed in the symmetrical loading zone of the rotating barrel of the orientation molding device, and the angular velocity of the rotating barrel was set to be 70 r/min for a circumferential motion; during the circumferential motion, the composition entered the gap between the rotating barrel and the sleeve barrel from the opening at a lower side of the rotating barrel under the action of centrifugal force, the distance between the rotating barrel and the sleeve barrel was 0.1 mm, the sleeve barrel was filled with a circulating cooling water, and the composition was sheared at high speed to form a thin-layer composition in which the carbon fibers were oriented in the direction of the shear force, the interval time of the piston leaving the sleeve barrel was set to be 3 s, the speed of the piston leaving the sleeve barrel each time was set to be 3 mm/min, and the thin-layer composition was collected in the die layer by layer to form a continuous multi-layer aggregate;

Step S3, curing: the die in step S2 was electrically heated to 120° C., and then kept heating for 30 minutes to heat cure the multi-layer aggregate inside the die to obtain an oriented composition block, which was taken out of the die; and Step S4, slicing: the oriented composition block obtained in step S3 was sliced step by step along the thickness direction using the ultrasonic cutting knife, and the increment of each step was set to 2 mm to obtain an oriented heat conducting sheet with a thickness of 2 mm.

Figure 5:
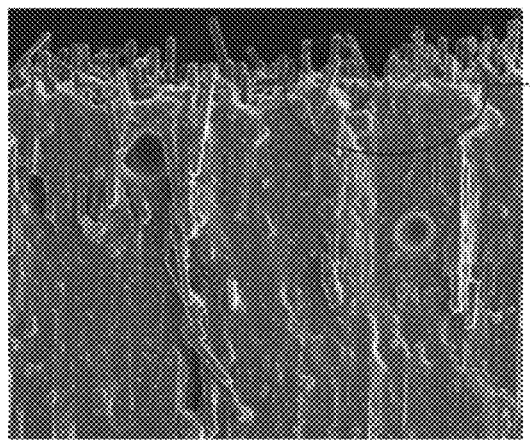
FIG. 5 is an electron microscope image of the oriented heat conducting sheet obtained in Example 2 (FIG. A is a planed scanning electron microscope image of the oriented heat conducting sheet, and FIG. B is a partially enlarged scanning electron microscope image of a designated part in FIG. A).
Figure 5:
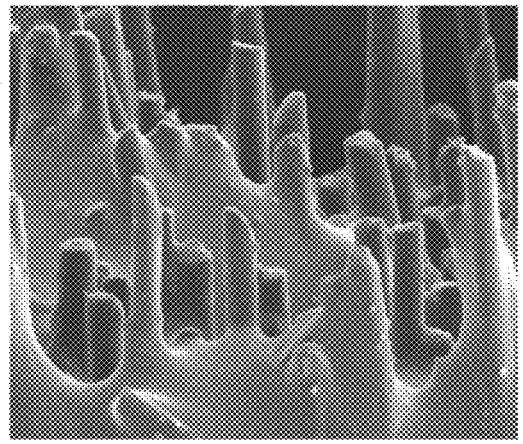

FIG. 5 is an electron microscope image of the oriented heat conducting sheet obtained in this Example. Among them, FIG. A is a planed scanning electron microscope image of the oriented heat conducting sheet, and FIG. B is a partially enlarged scanning electron microscope image of the designated part in FIG. A. It can be seen that the carbon fibers in the oriented heat conducting sheet obtained in this Example were fully oriented.

Example 3

This Example provides a method for preparing an oriented heat conducting sheet, using an orientation molding device in Example 1, and the specific implementation steps are as follows:

Step S1, mixing: 100 g of reactive silicone oil (a mixture of 55 g of vinyl silicone oil, 44.9 g of hydrogen-containing silicone oil and 0.1 g of platinum catalyst), 120 g of carbon fiber powder (with a length of 0.1 mm and a diameter of 15 µm), 300 g of spherical alumina and 50 g of spherical aluminum nitride were mixed and stirred for 30 min, and defoamed under vacuum for 5 minutes to form a fluid composition with a viscosity of 650,000 mPa·s;

Step S2, orientation molding: the fluid composition obtained in step S1 was placed in the symmetrical loading zone of the rotating barrel of the orientation molding device, and the angular velocity of the rotating barrel was set to be 90 r/min for a circumferential motion. During the circumferential motion, the composition entered the gap between the rotating barrel and the sleeve barrel from the opening at a lower side of the rotating barrel under the action of centrifugal force, the distance between the rotating barrel and the sleeve barrel was 0.2 mm, the sleeve barrel was filled with a circulating cooling water, and the composition was sheared at high speed to form a thin-layer composition in which the carbon fibers were oriented in the direction of the shear force, the interval time of the piston leaving the sleeve barrel was set to be 5 s, the speed of the piston leaving the sleeve barrel each time was set to be 4 mm/min, and the thin-layer composition was collected in the die layer by layer to form a continuous multi-layer aggregate;

Step S3, curing: the die in step S2 was electrically heated to 120° C., and then kept for 30 minutes to heat cure the multi-layer aggregate inside the die to obtain an oriented composition block, which was taken out of the die; and Step S4, slicing: the oriented composition block obtained in step S3 was sliced step by step along the thickness direction using the ultrasonic cutting knife, and an increment for each step was set to 2 mm to obtain an oriented heat conducting sheet with a thickness of 2 mm.

Example 4

This Example provides a method for preparing an oriented heat conducting sheet, using an orientation molding device in Example 1, and the specific implementation steps are as follows:

Step S1, mixing: 100 g of reactive silicone oil (a mixture of 55 g of vinyl silicone oil, 44.9 g of hydrogen-containing silicone oil and 0.1 g of platinum catalyst), 85 g of boron nitride micro-sheets, 350 g of spherical alumina and 50 g of spherical silicon carbide were mixed and stirred for 30 min. After defoaming in vacuum for 5 minutes, a fluid composition with a viscosity of 1,000,000 mPa·s was formed;

Step S2, orientation molding: the fluid composition obtained in step S1 was placed in the symmetrical loading zone of the rotating barrel of the orientation molding device, and the angular velocity of the rotating barrel was set to be 90 r/min for a circumferential motion; during the circumferential motion, the composition entered the gap between the rotating barrel and the sleeve barrel from the opening at a lower side of the rotating barrel under the action of centrifugal force, the distance between the rotating barrel and the sleeve barrel was 1 mm, the sleeve barrel was filled with a circulating cooling water, and the composition was sheared at high speed to form a thin-layer composition in which the carbon fibers were oriented in the direction of the shear force, the interval time of the piston leaving the sleeve barrel was set to be 5 s, the speed of the piston leaving the sleeve barrel each time was set to be 40 mm/min, and the thin-layer composition was collected in the die layer by layer to form a continuous multi-layer aggregate;

Step S3, curing: the die in step S2 was electrically heated to 120° C., and then kept for 30 minutes to heat cure the multi-layer aggregate inside the die to obtain an oriented composition block, which was taken out of the die; and Step S4, slicing: the oriented composition block obtained in step S3 was sliced step by step along the thickness direction using the ultrasonic cutting knife, and the increment for each step was set to 2 mm to obtain an oriented heat conducting sheet with a thickness of 2 mm.

Example 5

This Example provides a method for preparing an oriented heat conducting sheet, using an orientation molding device in Example 1, and the specific implementation steps are as follows:

Step S1, mixing: 100 g of reactive silicone oil (a mixture of 55 g of vinyl silicone oil, 44.9 g of hydrogen-containing silicone oil and 0.1 g of platinum catalyst), 150 g of carbon fiber powder (with a length of 0.1 mm and a diameter of 15 µm) and 400 g of spherical alumina were mixed and stirred for 30 min. After defoaming in vacuum for 5 minutes, a fluid composition with a viscosity of 200,000 mPa·s was formed;

Step S2, orientation molding: the fluid composition obtained in step S1 was placed in the symmetrical loading zone of the rotating barrel of the orientation molding device, and the angular velocity of the rotating barrel was set to be 150 r/min for a circumferential motion; during the circumferential motion, the composition entered the gap between the rotating barrel and the sleeve barrel from the opening at a lower side of the rotating barrel under the action of centrifugal force, the distance between the rotating barrel and the sleeve barrel was 2 mm, the sleeve barrel was filled with a circulating cooling water, and the composition was sheared at high speed to form a thin-layer composition in which the carbon fibers were oriented in the direction of the shear force, the interval time of the piston leaving the sleeve barrel was set to be 2 s, the speed of the piston leaving the sleeve barrel each time was set to be 140 mm/min, and the thin-layer composition was collected in the die layer by layer to form a continuous multi-layer aggregate;

Step S3, curing: the die in step S2 was electrically heated to 120° C., and then kept for 30 minutes to heat cure the multi-layer aggregate inside the die to obtain an oriented composition block, which was taken out of the die; and Step S4, slicing: the oriented composition block obtained in step S3 was sliced step by step along the thickness direction using the ultrasonic cutting knife, and the increment of each step was set to 2 mm to obtain an oriented heat conducting sheet with a thickness of 2 mm.

Example 6 Performance Test

In this Example, the thermal conductivity performance test of the oriented heat conducting sheets prepared in Examples 2-5 was carried out. The test method of thermal conductivity was to use the thermal steady state method, and the test standard is ASTM D5470. The steps are as follows: a heat conducting gasket with a thickness of 2 mm was cut into a square piece of 26×26 mm, then the square piece was placed in a Ruiling LW-9389 thermal conductivity tester, the pressure was set to 10 psi and the thermal conductivity was measured. The results are shown in the following table.

|  | Example 2 | Example 3 | Example 4 | Example 5 |
|---|---|---|---|---|
| Addition type silicone oil (g) | 100 | 100 | 100 | 100 |
| Carbon fiber powder (g) | 75 | 120 | 0 | 150 |
| Boron nitride microflakes (g) | 0 | 0 | 75 | 0 |
| Alumina (g) | 300 | 300 | 350 | 400 |
| Aluminum nitride (g) | 0 | 50 | 0 | 0 |
| Silicon carbide (g) | 0 | 0 | 50 | 0 |
| Viscosity of the fluid composition (mPa · s) | 200,000 | 650,000 | 1,000,000 | 2,000,000 |
| Angular velocity of the rotating barrel (r/min) | 70 | 90 | 90 | 150 |
| Thickness of the oriented heat conducting sheet (mm) | 2 | 2 | 2 | 2 |
| Thermal conductivity (W/m · k) | 13 | 17 | 7 | 23 |

It can be seen that the oriented heat conducting sheet prepared by the method of the present application has high thermal conductivity.

Example 7

Figure 6:
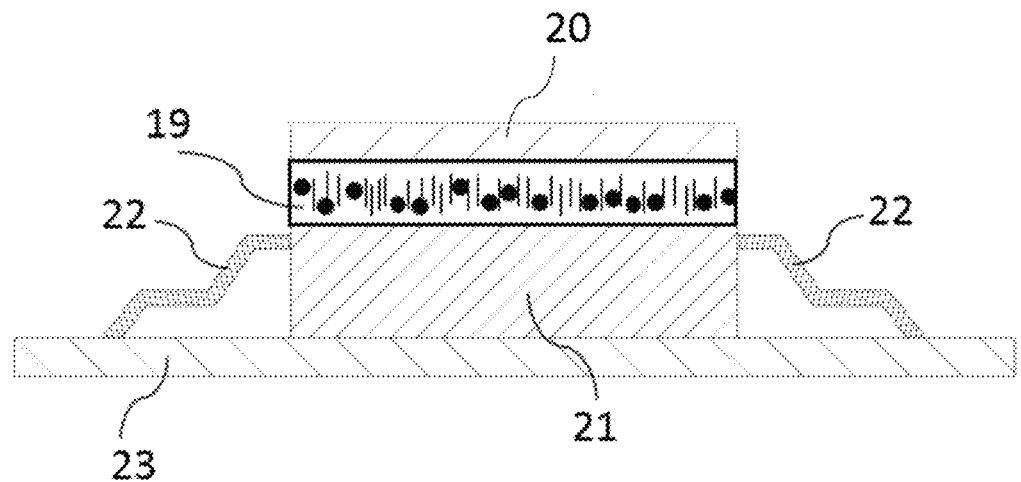
FIG. 6 is a schematic sectional view of a semiconductor heat dissipating device according to Example 7.

This Example provides a semiconductor heat dissipation device using the oriented heat conducting sheets obtained in Examples 2 to 5, in which the heat conducting sheet 19 was fixed between the opposite surfaces of the radiator 20 and the packaged chip 21, as shown in FIG. 6. The semiconductor heat dissipation device was disposed on the chip 21 packaged by the circuit board 23, and the semiconductor heat dissipation device includes the heat conducting sheet 19 disposed on the chip 21, the radiator 20 disposed on the oriented heat conducting sheet 19, and the side surface of the packaged chip 21 is provided with the pins 22.

The above are only the preferred embodiments of the present application. It should be pointed out that for those skilled in the art, without departing from the principles of the present application, several improvements and modifications can be made. It should be regarded as the protection scope of the present application.

What is claimed is:

1. A method for preparing an oriented heat conducting sheet, comprising the following steps:
   Step S1, preparing a fluid composition for a heat conducting sheet;
   Step S2: placing the fluid composition obtained in step S1 in an orientation molding device, applying a circumferential shear force to the fluid composition layer by layer to enable thermal conducting fillers in the fluid composition to be oriented along a shear direction to form an oriented thin-layer composition, and collecting the thin-layer composition layer by layer in a die to form a continuous multi-layer aggregate;
   Step S3: heat curing the continuous multi-layer aggregate obtained in step S2 to obtain an oriented composition block; and
   Step S4: slicing the oriented composition block obtained in step S3 along a direction perpendicular to an orienting direction of the oriented composition block to obtain the oriented heat conducting sheet;
   wherein, the orientation molding device comprises:
   a cylindrical rotating barrel, wherein a rotating shaft is fixed on a central axis of the cylindrical rotating barrel, and one end of the rotating shaft is provided with a first motor, and the first motor drives the cylindrical rotating barrel to rotate via the rotating shaft; the cylindrical rotating barrel is provided with a loading zone, and a rotating barrel opening is provided at a lower side of the loading zone;
   a sleeve barrel, wherein the sleeve barrel is sleeved outside the cylindrical rotating barrel, the cylindrical rotating barrel is configured to rotate inside the sleeve barrel, and a sleeve barrel opening with a same size as the rotating barrel opening is arranged at an end of the sleeve barrel opposite to the rotating barrel opening;
   the die, wherein the die is provided with an inner cavity and an inner cavity opening, and an edge of the inner cavity opening is flush with and next to an edge of the sleeve barrel opening, the edge of the inner cavity opening extends inwardly along a horizontal direction perpendicular to the central axis of the cylindrical rotating barrel to form a side wall of the inner cavity, a piston and a second motor are provided next to the side wall of the inner cavity; the second motor is configured to drive the piston away from the sleeve barrel opening, a starting position of the piston is flush with the sleeve barrel opening; and
   an electric heating module, wherein the electric heating module is configured to heat the inner cavity of the die;
   wherein there is a gap of 0.1 to 5 mm between the cylindrical rotating barrel and the sleeve barrel; and
   wherein the piston is driven by the second motor to leave the sleeve barrel opening intermittently.

2. The method for preparing an oriented heat conducting sheet according to claim 1, wherein the step S1 comprises mixing and defoaming an addition type silicone oil and the thermal conducting fillers to form the fluid composition.

3. The method for preparing an oriented heat conducting sheet according to claim 2, wherein in step S1, the thermal conducting fillers comprise at least one of a fibrous thermal conducting filler or a sheet-like thermal conducting filler, and a spherical thermal conducting filler.

4. The method for preparing an oriented heat conducting sheet according to claim 3, wherein the fibrous thermal conducting filler is one selected from a group consisting of a carbon fiber, a carbon nanotube fiber and a graphene fiber; the sheet-like thermal conducting filler is one selected from a group consisting of a hexagonal boron nitride micro-sheet and a graphite micro-sheet; and the spherical thermal conducting filler is one or more selected from a group consisting of alumina, aluminum nitride and silicon carbide.

5. The method for preparing an oriented heat conducting sheet according to claim 3, wherein in step S1, a mass ratio of the fibrous thermal conducting filler or the sheet-like thermal conducting filler to the addition type silicone oil is 0.5 to 2.5, and the spherical thermal conducting filler accounts for 50 to 80% of a total mass of the fluid composition.

6. The method for preparing an oriented heat conducting sheet according to claim 1, wherein in step S1, the fluid composition has a viscosity of 200,000 to 3,000,000 mPa·s.

7. The method for preparing an oriented heat conducting sheet according to claim 1, wherein in step S2, the orientation molding device drives the fluid composition to move circumferentially, so that the circumferential shear force is applied to the fluid composition layer by layer to orient the thermal conducting fillers in the fluid composition along the shear direction, thereby forming the oriented thin-layer composition.

8. The method for preparing an oriented heat conducting sheet according to claim 1, wherein the loading zone is symmetrically arranged around the central axis of the cylindrical rotating barrel;

the loading zone comprises two sectorial cylindrical zones symmetrically arranged around the central axis of the cylindrical rotating barrel; and an interlayer is provided in the sleeve barrel, and filled with a cooling medium.

9. An oriented heat conducting sheet obtainable by a method for preparing an oriented heat conducting sheet according to claim 1.

10. A semiconductor heat dissipating device comprising an oriented heat conducting sheet according to claim 9, wherein the oriented heat conducting sheet is sandwiched between a packaged chip and a radiator.

* * * * *